(12) United States Patent
Glavin et al.

(10) Patent No.: US 10,957,789 B1
(45) Date of Patent: Mar. 23, 2021

(54) METHOD FOR FLEXIBLE RADIO-FREQUENCY DEVICES

(71) Applicant: Government of the United States, as represented by the Secretary of the Air Force, Wright-Patterson AFB, OH (US)

(72) Inventors: Nicholas R. Glavin, Springboro, OH (US); Kelson D. Chabak, Springboro, OH (US); Michael R. Snure, Dayton, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 15/931,670

(22) Filed: May 14, 2020

Related U.S. Application Data

(62) Division of application No. 16/266,245, filed on Feb. 4, 2019, now Pat. No. 10,692,996.

(60) Provisional application No. 62/626,436, filed on Feb. 5, 2018.

(51) Int. Cl.
| | |
|---|---|
| *H01L 29/15* | (2006.01) |
| *H01L 29/778* | (2006.01) |
| *H01L 29/66* | (2006.01) |
| *H01L 21/02* | (2006.01) |
| *H01L 29/20* | (2006.01) |
| *H01L 29/205* | (2006.01) |

(52) U.S. Cl.
CPC ........ *H01L 29/778* (2013.01); *H01L 21/0254* (2013.01); *H01L 29/2003* (2013.01); *H01L 29/205* (2013.01); *H01L 29/66462* (2013.01)

(58) Field of Classification Search
CPC .......... H01L 29/7787; H01L 29/42316; H01L 29/475
See application file for complete search history.

(56) References Cited

U.S. PATENT DOCUMENTS

| | | | |
|---|---|---|---|
| 7,521,292 | B2 | 4/2009 | Rogers |
| 7,557,367 | B2 | 7/2009 | Rogers |
| 7,799,699 | B2 | 9/2010 | Nuzzo |

(Continued)

OTHER PUBLICATIONS

Nicholas R. Glavin, Kelson D. Chabak, Eric R. Heller, Elizabeth A. Moore, Timothy A. Prusnick, Benji Maruyama, Dennis E. Walker Jr., Donald L. Dorsey, Qing Paduano, Michael Snure, "Flexible Gallium Nitride for High-Performance, Stainable Radio-Frequency Devices," Advanced Materials, 29, 47, https://doi.org/10.1002/adma.201701838, 2017.

(Continued)

*Primary Examiner* — Phuc T Dang
(74) *Attorney, Agent, or Firm* — AFMCLO/JAZ; Timothy Barlow

(57) ABSTRACT

Systems, methods and apparatus incorporating Gallium Nitride heterostructure $(Al_x,In_y)Ga_{1-x-y}$ N-materials in flexible, strainable and wearable radio frequency devices. These devices include $(Al_x,In_y)Ga_{1-x-y}$ N-based high-electron mobility transistors (HEMTs), which enable amplification of microwave radio frequencies from approximately 300 MHz to approximately 300 GHz for flexible and conformal wireless transmission.

10 Claims, 6 Drawing Sheets

(56) References Cited

U.S. PATENT DOCUMENTS

| | | |
|---|---|---|
| 8,198,621 B2 | 6/2012 | Rogers |
| 8,470,701 B2 | 6/2013 | Rogers |
| 8,552,299 B2 | 10/2013 | Rogers |
| 8,865,489 B2 | 10/2014 | Rogers |
| 8,895,406 B2 | 11/2014 | Rogers |
| 8,980,673 B2 | 3/2015 | Lee |
| 9,082,844 B2 | 7/2015 | Cho |
| 9,096,050 B2 | 8/2015 | Bedell |
| 9,171,909 B2 | 10/2015 | Zimmerman |
| 9,299,887 B2 | 3/2016 | Lowenthal |
| 9,337,274 B2 | 5/2016 | Dimitrakopoulos |
| 9,515,025 B2 | 12/2016 | Rogers |
| 9,666,674 B2 | 5/2017 | Dimitrakopoulos |
| 9,698,053 B2 | 7/2017 | Hayes |
| 9,748,353 B2 | 8/2017 | Bedell |
| 2002/0017653 A1* | 2/2002 | Chuang ............... H01L 33/007 257/103 |
| 2006/0076584 A1 | 4/2006 | Kim |
| 2009/0294803 A1 | 12/2009 | Nuzzo |
| 2011/0174377 A1 | 7/2011 | Lee |
| 2012/0280377 A1* | 11/2012 | Do ................... H01L 23/49582 257/676 |
| 2012/0295376 A1 | 11/2012 | Lee |
| 2013/0100618 A1 | 4/2013 | Rogers |
| 2013/0140517 A1 | 6/2013 | Tang |
| 2013/0220408 A1 | 8/2013 | Bedell |
| 2014/0217356 A1 | 8/2014 | Bayram |
| 2015/0258769 A1 | 9/2015 | Farah |
| 2016/0142015 A1* | 5/2016 | Volokhine ............... H03F 3/193 330/307 |
| 2016/0233269 A1 | 8/2016 | Choi |
| 2016/0327220 A1 | 11/2016 | Tischler |
| 2016/0380600 A1 | 12/2016 | Diduck |
| 2017/0110565 A1 | 4/2017 | Jacquet |
| 2017/0301781 A1 | 10/2017 | Boles |
| 2018/0053746 A1 | 2/2018 | Yu |
| 2018/0108838 A1 | 4/2018 | Takayama |
| 2018/0295722 A1 | 10/2018 | Renshaw |

OTHER PUBLICATIONS

John E. Penn, "Gallium Nitride Monolithic Microwave Integrated Circuit Designs Using 0.25-μm Qorvo Process," ARL-TN-0836, https://www.arl.army.mil/arlreports/2017/technical-report.cfm?id=7928, Jul. 2017.

John E. Penn, "Gallium Nitride (GaN) Monolithic Microwave Integrated Circuit (MMIC) Designs Submitted to Air Force Research Laboratory (AFRL)-Sponsored Qorvo Fabrication," ARL-TN-0835, www.arl.army.mil/arlreports/2017/ARL-TN-0835.pdf, Jul. 2017.

John E. Penn, "Broadband 0.25-μm Gallium Nitride (GaN) Power Amplifier Designs," ARL-TR-8091, https://apps.dtic.mil/docs/citations/AD1038718, Aug. 2017.

* cited by examiner

METHOD FOR FLEXIBLE RADIO-FREQUENCY DEVICES

CROSS REFERENCE TO RELATED APPLICATIONS

This application claims the benefit under 35 U.S.C. § 119(e) of U.S. Provisional Patent Application Ser. No. 62/626,436 filed on Feb. 5, 2018, the entire contents of which are hereby incorporated herein by reference, and U.S. patent application Ser. No. 16/266,245, filed on 4 Feb. 2019.

STATEMENT OF GOVERNMENT INTEREST

The embodiments described herein may be manufactured and used by or for the Government of the United States for all governmental purposes without the payment of any royalty.

INCORPORATION BY REFERENCE

This application incorporates by reference, in its entirety, U.S. Ser. No. 62/536,524, filed Jul. 25, 2017 and U.S. Ser. No. 16/043,456, filed 24 Jul. 2018.

FIELD OF THE DISCLOSURE

The present disclosure relates to wearable, flexible radio frequency devices, and systems, methods and apparatus thereof.

BACKGROUND

Gallium nitride (GaN)-based devices are a useful technology to address requirements for high power amplification of the radio frequency (RF) signal in MHz to GHz frequencies and beyond, especially for military applications, and are prime candidates to replace legacy Si or GaAs devices.

BRIEF SUMMARY

Embodiments described herein are directed to systems, methods and apparatus incorporating Gallium Nitride heterostructure $(Al_x,In_y)Ga_{1-x-y}$ N-materials in flexible and strainable radio frequency devices. These devices include $(Al_x,In_y)Ga_{1-x-y}$ N-based high-electron mobility transistors (HEMTs) which enable amplification of microwave radio frequencies from approximately 300 MHz to approximately 300 GHz for flexible and conformal wireless transmission.

One embodiment is an apparatus that comprises a substrate material; and a semiconductor layer affixed to the substrate material, via an interface, the semiconductor layer providing a radio-frequency device that amplifies microwave radio frequencies.

According to one embodiment, the interface is an accommodation interface that comprises one or more of an adhesive material and van der Waals bonding.

According to one embodiment, the amplification of microwave radio frequencies by the radio frequency device is from approximately 300 MHz to approximately 300 GHz.

According to one embodiment, the amplification of microwave radio frequencies by the radio frequency device is configured for wireless transmission.

According to one embodiment, where the semiconductor layer comprises a gallium nitride film layer.

One embodiment may further comprise forming a heterostructure $(Al_x,In_y)Ga_{1-x-y}$N-material.

According to one embodiment, the gallium nitride film layer is a thin film.

According to one embodiment, the substrate material supports the gallium nitride film layer.

According to one embodiment, the radio-frequency device comprises a flexible and strainable radio-frequency amplifier.

According to one embodiment, the flexible and strainable radio-frequency amplifier is on a flexible substrate.

According to one embodiment, the radio frequency device is externally strained to greater than 0% but less than 100%.

According to one embodiment, the radio-frequency device comprises a $(Al_x,In_y)Ga_{1-x-y}$N-based high-electron mobility transistor (HEMT).

A first method comprises providing a substrate; mounting a semiconductor layer on a surface of the substrate, via an interface, where the semiconductor layer provides a radio-frequency device that is operable to amplify microwave radio frequencies.

According to another embodiment, the method may further comprise forming the interface using an adhesive.

According to another embodiment, the method may further comprise forming the interface using van der Waals forces.

According to another embodiment, the method may further comprises amplifying microwave radio frequencies by the radio frequency device from approximately 300 MHz to approximately 300 GHz.

According to another embodiment, the method may further comprise forming the semiconductor layer using a gallium nitride layer.

According to another embodiment, the method may further comprise forming the gallium nitride layer with a heterostructure $(Al_x,In_y)Ga_{1-x-y}$N-material.

According to another embodiment, the method may further comprise forming the gallium nitride layer as a thin film.

According to another embodiment, the substrate material supports the gallium nitride layer.

According to another embodiment, the radio-frequency device comprises a flexible and strainable radio-frequency amplifier.

According to another embodiment, the radio frequency device is operating under an externally applied strain of greater than 0% but less than 100%

According to another embodiment, the radio-frequency device comprises a $(Al_x,In_y)Ga_{1-x-y}$N-based high-electron mobility transistor (HEMT).

According to another embodiment, the radio-frequency device comprises a $(Al_x,In_y)Ga_{1-x-y}$N-based heterostructure device.

According to another embodiment, the method may further comprise growing the $(Al_x,In_y)Ga_{1-x-y}$N-based heterostructure device directly on the substrate.

According to another embodiment, the method may further comprise transferring the $(Al_x,In_y)Ga_{1-x-y}$N-based heterostructure device to the substrate.

A second method comprises producing a wafer scale having a diameter of approximately 2 inches; mounting one or more BN films having a thickness uniformity deviation of less than approximately 5% and a roughness less than approximately 0.1 nm on the wafer; mounting a flexible GaN HEMT structure having a AlN nucleation layer of approximately 15 nm; and mounting a Fe-doped GaN buffer approximately 1.5 µm thick.

BRIEF DESCRIPTION OF THE DRAWINGS

The accompanying drawings, which are incorporated in and constitute a part of this specification, illustrate embodiments of the present disclosure and, together with a general description given above, and the detailed description given below, serve to explain the principles of the present disclosure.

Figure 1A:
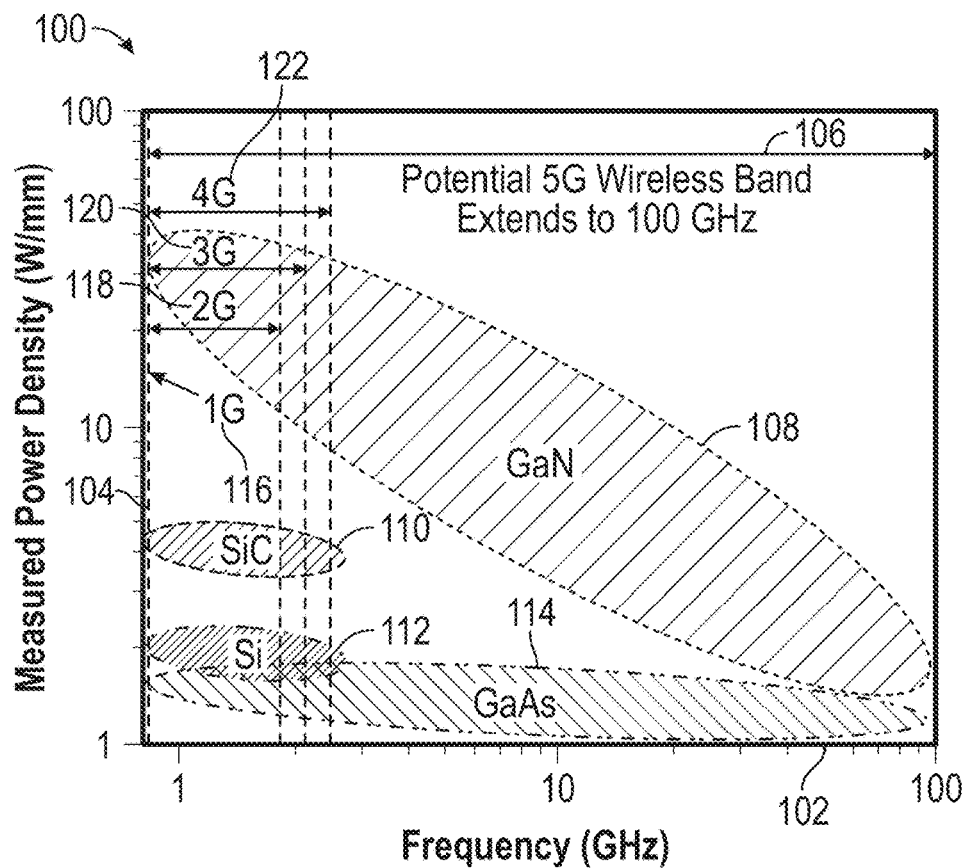
FIG. 1A is a graph showing measured RF power density at different operational frequencies for RF amplifier materials.

It should be understood that the appended drawings are not necessarily to scale, presenting a somewhat simplified representation of various features illustrative of the basic principles of the disclosure. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION

The present disclosure will now be described more fully hereinafter with reference to the accompanying drawings, in which preferred embodiments are shown. This disclosure may, however, be embodied in many different forms and should not be construed as limited to the embodiments set forth herein. Rather, these embodiments are provided so that this disclosure will be thorough and complete, and will fully convey the scope to those skilled in the art. Those of ordinary skill in the art realize that the following descriptions of the embodiments of the present disclosure are illustrative and are not intended to be limiting in any way. Other embodiments will readily suggest themselves to such skilled persons having the benefit of this disclosure. Like numbers refer to like elements throughout.

Although the following detailed description contains many specifics for the purposes of illustration, anyone of ordinary skill in the art will appreciate that many variations and alterations to the following details are within the scope of the disclosure. Accordingly, the following embodiments are set forth without any loss of generality to, and without imposing limitations upon, the claims.

In this detailed description, a person skilled in the art should note that directional terms, such as "above," "below," "upper," "lower," and other like terms are used for the convenience of the reader in reference to the drawings. Also, a person skilled in the art should notice this description may contain other terminology to convey position, orientation, and direction without departing from the principles of the present disclosure.

Furthermore, in this detailed description, a person skilled in the art should note that quantitative qualifying terms such as "generally," "substantially," "mostly," "approximately" and other terms are used, in general, to mean that the referred to object, characteristic, or quality constitutes a majority of the subject of the reference. The meaning of any of these terms is dependent upon the context within which it is used, and the meaning may be expressly modified.

As stated above, the disclosure is directed to systems, apparatus and methods of incorporating Gallium Nitride heterostructure $(Al_x,In_y)Ga_{1-x-y}N$-materials in flexible and strainable (being able to withstand a mechanical strain and/or mechanical deformation beyond a flat state, without detrimental performance affects) radio frequency devices, including amplifier devices. As described herein, the systems, apparatus and methods allow wearable devices to be flexible from approximately 0% to approximately 50%. Conformable electronic devices are flexible from approximately 0% to approximately 15%. These wearable and conformable devices include $(Al_x,In_y)Ga_{1-x-y}N$-based high-electron mobility transistors (HEMTs) which enable amplification of microwave radio frequencies from approximately 300 MHz to approximately 300 GHz for flexible and conformal wireless transmission. These devices have the characteristics of flexibility and conformal to be wearable by a person as affixed or attached to a garment.

The described Gallium Nitride-based heterostructured $((Al_x,In_y)Ga_{1-x-y}N)$ power amplifier is a suitable component in many radar and wireless communication systems for amplifying the power of a radio signal. The use of this material and heterostructured devices in a flexible and conformal form factor for uses including, but not limited to, flexible electronics, conformal radar, and strainable wireless systems.

As described herein, flexible $(Al_x,In_y)Ga_{1-x-y}N$-based radio frequency amplifier devices are used to effectively increase the power of radio signals while being able to accommodate strain and operate in a flexible form factor, including clothing. The $(Al_x,In_y)Ga_{1-x-y}N$-based heterostructure devices can either be grown directly on a flexible substrate or transferred by various means including, but not limited to, an h-BN release layer, laser lift-off procedure, substrate thinning, and other methods to transfer the film or devices to a flexible substrate.

The substrate may be comprised of, for example, Polyethylene, Polypropylene, Polyvinyl chloride, Polyethylene terephthalate (PET), Polyethylene-naphthalate (PEN), Polyimide, Polydimethylsiloxane (PDMS), Polydimethylsiloxane/graphite composites and other suitable materials having the desired chemical and mechanical properties.

The amplifier devices can be transistor-based or any other device used to enable amplification of microwave radio frequencies from approximately 300 MHz to approximately 300 GHz for use in a flexible and/or conformal form factor.

The disclosed device may be used in any flexible electronics applications for wireless communication or any conformal wireless applications for the things including the Internet of things, 5G wireless communication, autonomous vehicles, and radar applications.

Systems for use in wireless communication, the Internet of things (IoT), 5G wireless communication, autonomous vehicles, and radar applications are enhanced by a small footprint, wide bandwidth, and high-power radio frequency amplifier devices of desired performance.

In addition, the reduction in signal propagation at higher frequencies suggest an increase in the number of amplifiers needed for effective wireless infrastructure. To more effectively accomplish this, the wireless platform, including the RF devices, can be engineered to flex and conform towards integration on compact and mobile platforms. Allowing for the devices to accommodate strain will ultimately reduce the two-dimensional footprint of the device, enable wireless systems to be placed onto non-planar platforms or surfaces, and improve overall mechanical reliability.

Described herein are radio frequency amplifiers in the range of approximately 300 MHz to approximately 300 GHz whose semiconducting component within the device is Gallium Nitride or a Gallium Nitride.

Flexible gallium nitride (GaN) thin films can enable strainable and conformal devices for transmission of radio-frequency (RF) signals over large distances for example, two feet to 10 miles, based on the power. The greater the power, the greater the distance and use for more efficient wireless communication. The transmission is also suitable for WiFi applications. Strainable high-frequency RF GaN devices are described, whose exceptional performance is enabled by epitaxial growth on 2D boron nitride for chemical-free transfer to a soft, flexible substrate. The AlGaN/GaN heterostructures transferred to flexible substrates are uniaxially strained up to approximately 0.85% and provide desired values for electrical performance, with electron mobility exceeding 2000 cm$^2$/Vs and sheet carrier density above $1.07 \times 10^{13}$ cm$^{-2}$ ($1.07 \times 10^{13}$/cm$^2$).

Also as described herein, the influence of strain on the RF performance of flexible GaN high-electron-mobility transistor (HEMT) devices is evaluated, demonstrating cutoff frequencies and maximum oscillation frequencies greater than approximately 42 and approximately 74 GHz, respectively, at up to approximately 0.43% strain, representing a significant advancement toward conformal, highly integrated electronic materials for RF applications.

As the market demands high-power conformal and flexible electronics for future fifth generation (SG) wireless communication operating as high as 100 GHz and speeds as high as 10 Gb s$^{-1}$ (10 Gb/s), amplifiers based on GaN technology are prime candidates to replace existing Si or GaAs devices. The next generation wireless systems show that consumers will benefit significantly from the high-power densities achievable in GaN devices.

However, complicating the paradigm shift for SG and new wireless capabilities, the reduction in signal propagation at higher frequencies means an increase in the number of amplifiers for effective wireless infrastructure. To more effectively accomplish this, the wireless platform including the RF devices, can be engineered to flex and conform toward integration on compact and mobile platforms. Devices that accommodate strain are important because it will ultimately reduce the 2D footprint of the device, enable wireless systems to be placed onto nonplanar platforms or surfaces, and improve overall mechanical reliability.

Described herein is a growth method to achieve flexible GaN films specifically for high performing RF devices. In addition, RF characteristics of flexible T-gated GaN high electron mobility (HEMT) devices released from the substrate with the use of a 2D boron nitride (BN) mechanical release layer were demonstrated to be strainable and flexible.

Described herein is an apparatus comprising: a substrate material; and a semiconductor layer affixed to the substrate material, via an interface, the semiconductor layer providing a radio-frequency device that amplifies microwave radio frequencies.

The apparatus utilizes an accommodation interface, as the interface, which comprises one or more of an adhesive material and van der Waals bonding.

The amplification of microwave radio frequencies by the radio frequency device(s), as described herein, is from approximately 300 MHz to approximately 300 GHz. The amplification of microwave radio frequencies by the radio frequency device(s) is configured for wireless transmission.

The apparatus also includes the semiconductor layer comprising a gallium nitride film layer, which may form a heterostructure (Al$_x$,In$_y$)Ga$_{1-x-y}$N-material, as an embodiment. Additionally, the gallium nitride film layer may be a thin film.

Another embodiment includes the substrate material supporting the gallium nitride film layer.

Additionally, the apparatus described herein, including the radio-frequency device, comprises a flexible and strainable radio-frequency amplifier, which may be a transistor, in some embodiments. The radio-frequency device may comprise a (Al$_x$,In$_y$)Ga$_{1-x-y}$N-based high-electron mobility transistor (HEMT).

FIG. 1A shows is a graph 100 showing measured RF power density at different operational frequencies for RF amplifier materials with the traditional wireless generation (first generation to fifth generation) frequency bands used within the United States.

Specifically, the X-axis 102 shows frequency in GHz. The Y-axis 104 shows measured power density (W/mm). The potential 5G wireless band is shown as line 106. Lines 116, 118, 120 and 122 show frequencies 1G, 2G, 3G and 4G, respectively. The GaN data 108 shows the superior performance at 100 GHz and 4G band 122. The GaAs performance 102, Si performance 112 and SiC performance 110 show less desirable performance characteristics of power density and frequency.

Figure 1B:
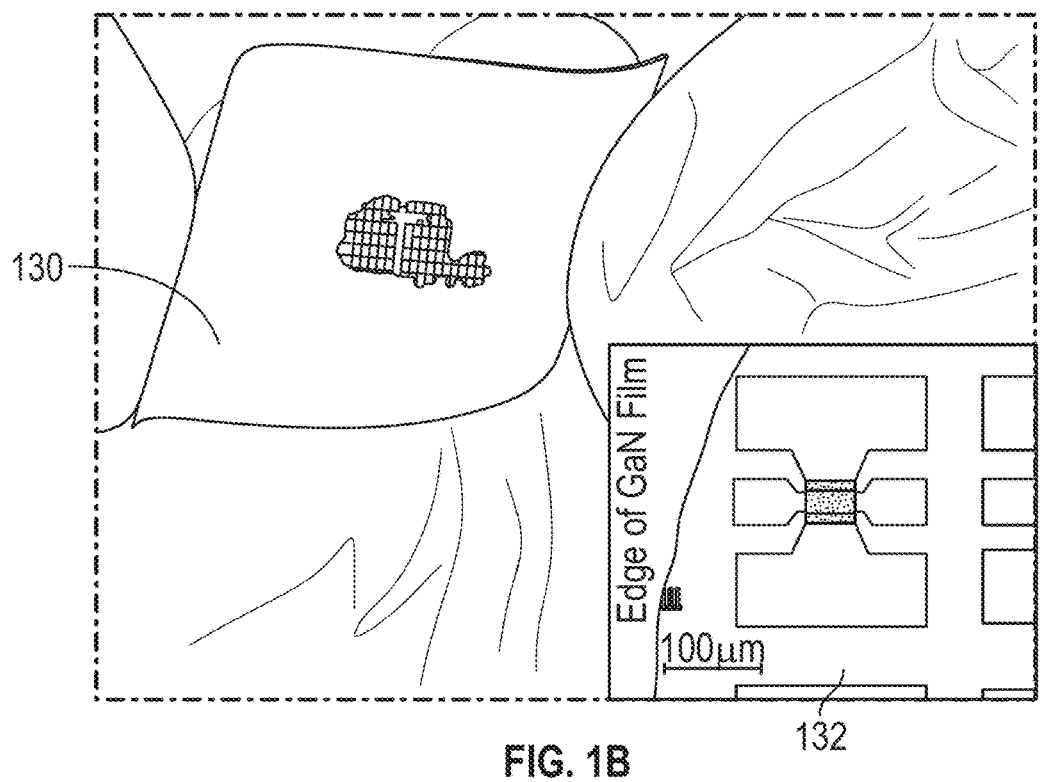
FIG. 1B is an image of flexible GaN devices.

FIG. 1B shows an image of flexible GaN devices 130 with the inset 132 showing a close-up of a flexible HEMT. The flexible devices, which are shown in FIG. 1B, advance the state of the art because while the flexibility in electronic systems, according to traditional wisdom, is believed to lead to a significant drop in performance, the GaN devices show enhanced performance.

Indeed, the potential for high-performance conformal, strainable wireless systems based on flexible GaN is shown by electron mobility exceeding 2000 cm$^2$ V$^{-1}$ s$^{-1}$ (2000 cm$^2$/Vs) at tensile strains as high as 0.85%, measured cutoff frequency, Jr, beyond approximately 42 GHz and maximum oscillation frequencies, Jmax, above approximately 74 GHz at strain levels of 0.43%. Thus, the present disclosure provides an advancement in the state of the art by describing and enabling a high-performance, flexible, wearable and strainable wireless system based on flexible GaN.

The growth of III-nitride materials, films, and device structures on 2D materials, such as graphene and boron nitride (BN), is attractive for many applications including high power high frequency electronic devices. As used herein, a layer of a semiconductor structure may include one or more materials, and multiple layers may constitute a film. The weak out-of-plane van der Waals (vdW) bonding between 2D materials relaxes the strict lattice matching requirements of typical three-dimensional (3D) heterostructures and as such may reduce strain and defect density.

In this regard, 2D refers to materials having one layer/unit in thickness, and 3D refers to materials having more than one layer/unit in thickness. The weak bonding between vdW layers can also be used to separate 3D materials from a growth substrate for subsequent transfer to a new substrate that provides different functionality, like flexibility, strainability, wearability or high thermal conductivity.

Methods for lifting, or transferring, devices from a growth substrate for transfer to another substrate are also provided.

One method of transferring devices from a growth substrate to another substrate uses a vdW buffer layer as a mechanical release layer. As used herein, vdW materials are layered compounds, like graphite, h-BN, molybdenite, etc., with strong chemical bonding in plane and weak dispersive bonding between layers. The weak bonding between vdW layers enables the mechanical separation at the interface between two vdW layers, a vdW layer and the substrate, or the vdW layer and the III-nitride material, or film.

Crystalline and epitaxial III-nitride films can be grown on vdW buffer layers by chemical vapor deposition (CVD). The inert nature and lack of dangling bonds on a vdW surface presents challenges to epitaxial growth. As such, many different nucleation approaches may be used for growth on vdW BN and graphene including nucleation layers (ZnO, AlN, GaN, or $Al_xGa_{1-x}N$) or surface functionalization. After the nucleation step, films and device structures are grown.

As mentioned, there are significant challenges to growth of high-quality epitaxial materials. These challenges are primarily due to a lack of dangling bonds on the surface of 2D materials making nucleation difficult. There are some advantages to using BN including dielectric properties and chemical resistance, which can serve to isolate and protect the GaN device structure. In an example, a thin AlN nucleation layer may be used for growth of high quality AlGaN/GaN heterostructures on few-layer BN on sapphire, with very high 2D electron gas (2 DEG) mobility.

AlN layers may be grown by metalorganic vapor-phase epitaxy at high temperatures up to 1500° C. Although the AlN nucleation has minimal impact on the properties of the AlGaN/GaN heterostructure, the BN substrate morphology might. Therefore, the embodiments herein utilize the effect of BN substrate morphology on the properties of bulk GaN and AlGaN/GaN heterostructures, wherein there is a clear relation between BN roughness and GaN crystallinity and transport properties. Moreover, there is a correlation between BN roughness and GaN separation, which allows for the optimization/selection of the BN substrate based on a desired application.

Some of the embodiments disclosed herein are directed to a semiconductor layer, such as group III nitride (e.g., group III-N) thin film or structure, for mechanical lift-off from a first substrate, which can be configured for epitaxial growth, and transferred to a second substrate, which can be arbitrarily selected according to one or more applications or desirable features. The semiconductor layer is grown epitaxially on a mechanical release layer, such as a thin h-BN vdW buffer layer, using an intervening nucleation layer. The thin h-BN vdW buffer layer may be approximately 0.1 nm to 100 nm. Typically, this thin layer is approximately 2 nm.

In some embodiments, the nucleation layer can be a thin AlN nucleation layer. The thin AlN nucleation layer may be approximately 0.1 nm to 100 nm. Typically, the thin nucleation layer is approximately 2 nm. As such, the embodiments disclosed herein are directed to the use of a vdW buffer layer as a mechanical release layer for III-nitride films and devices.

While epitaxial group III-N and group V films may be grown on the vdW buffer layers by chemical vapor deposition, the lack of dangling bonds in the vDdW buffer layer typically means using a nucleation layer to promote growth. GaN on 2D BN is useful to unlock high-quality flexible devices, as the BN serves two purposes: an epitaxial template for high-quality GaN that approaches state of the art standards for electrical performance and providing for a means, or vehicle, to transfer the devices without the use of harsh chemicals or etchants. The transferred flexible GaN/AlGaN structures are demonstrated to exhibit high electron mobility and sheet carrier density that exceeded 2000 $cm^{-2}V^{-1}s^{-1}$ (2000 $cm^2/Vs$) and $1.07 \times 10^{13}$ $cm^{-2}$, respectively, and show inverse behavior upon straining.

The embodiments disclosed herein can significantly improve the crystal quality of the epitaxial films by using at least one thin high quality AlN nucleation layer deposited in a two-step approach.

Consequently, according to present embodiments, the bonding strength of the semiconductor layer can be varied and/or controlled according to one or more properties of the mechanical release layer. For example, in embodiments where the mechanical release layer is an h-BN van der Waals buffer layer and the semiconductor layer is an III-nitride film, the morphology of the h-BN buffer can be varied or leveraged to control the bonding strength of the III-nitride films to the growth substrate.

Controlling bonding strength can be important based on the desired application, or potential processing, of the III-nitride films. While weakly bonded films can be easily separated and transferred for simple processing, more strongly bonded films are necessary for aggressive pre-transfer device processing. Embodiments disclosed herein allow for the bond strength of the film to the substrate to be varied by leveraging the morphology of the mechanical release layer to make mechanical lift-off easier. Moreover, the embodiments herein allow for greater yield in a semiconductor structure upon removal from the growth substrate. Epitaxial growth technology has been developed using crystalline non-native substrates such as, sapphire, SiC, and Si.

Since GaN grown by metal-organic chemical vapor deposition (MOCVD) typically utilizes growth temperatures greater than 1000° C. and stable crystalline substrates (Si, sapphire, SiC), to ultimately achieve flexible devices, they are typically transferred from the rigid growth substrate. Other techniques may be used to produce a mechanical release layer with similar morphologies. These include MBE, ALD, sputtering, or PLD, etc. to achieve similar variable bonding.

Transfer of GaN films and devices has been performed using two main strategies: laser lift-off of the GaN film; or etching to chemically remove the substrate.

Growth of GaN on Si simplifies the substrate etching removal process and has hence been the most widely used approach for development of transferred GaN electronics. However, the GaN material grown on Si is typically of lower quality than when grown on sapphire or SiC due to the significant structural and lattice mismatch.

It is also an embodiment to utilize a method involving epitaxial lift-off processes through a sacrificial layer or a 2D buffer layer, such as graphene or h-BN, has demonstrated transfer of GaN devices for light-emitting diodes without the use of harsh chemicals or etchants.

This h-BN mechanical release layer may be grown by chemical vapor deposition from triethylborane (TEB) and ammonia. To achieve this ordered structure and thickness, films were grown at temperatures in the range of 9000 to 1100° C., at low pressure (<100 Torr) and under a high ratio (>1800) of nitrogen ($NH_3$) to boron precursor.

Production of high-quality transferable GaN devices on van der Waals (vdW) layers has been facilitated by the recent availability of high-quality atomically smooth BN and grapheme epitaxial layers.

Epitaxy is the growth of a layer which continues the crystal structure of a substrate. The material grown can be the same as the substrate (known as homoepitaxy) or a different material (heteroepitaxy).

These layers serve multiple functions: providing a weak interface for film lift-off and removal and acting as an epitaxial template for growth of GaN. The weak interface typically has a bond strength of between approximately 0.1 Kilo-Joule per mole and 4 Kilo-Joule per mole. The morphology and quality of the layer can be linked to GaN crystal quality and adhesion strength to the substrate. BN films with roughness greater than only a few angstroms resulted in poor GaN crystal quality and films that will spontaneously release from the substrate, highlighting the usefulness of atomically smooth and flat BN.

Well-ordered BN films are found to be a desirable template for the combination of high-quality epitaxial growth, postgrowth device processing and mechanical lift-off. Using an MOCVD process, as described herein, a wafer scale (2 in. diameter) few-layer BN films with excellent thickness uniformity (<5%) and low roughness (<0.1 nm RMS) was produced that is suited to produce flexible AlGaN/GaN HEMTs.

Flexible GaN HEMT structures consisting of an approximately 15 nm AlN nucleation layer followed by an approximately 1.5 μm thick Fe-doped GaN buffer, approximately 0.5 μm undoped GaN layer, approximately 2 nm AlN insert layer, approximately 17 nm $Al_{0.27}Ga_{0.73}N$ boundary layer, and approximately 3 nm GaN cap, were grown by MOCVD on an approximately 1.6 nm BN layer on a sapphire substrate.

According to the present disclosure, a thin pinhole free AlN nucleation layer was found to produce GaN and AlGaN/GaN structures with the lowest roughness and dislocation densities. When the AlN nucleation layer is greater than approximately a few tens of nanometers strain between the nucleation and GaN layers can cause self-separation and buckling of the film.

Figure 2A:
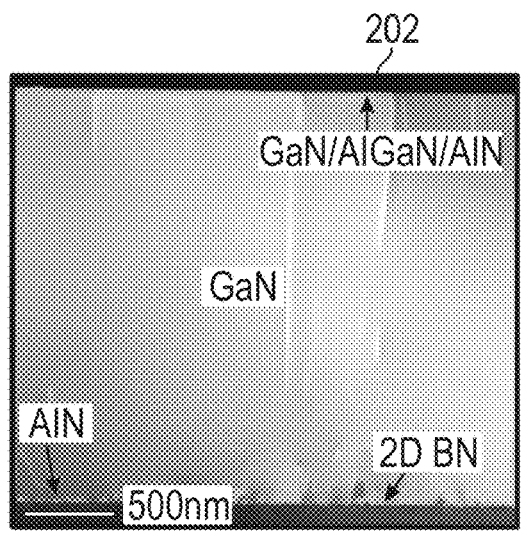
FIG. 2A shows a cross-sectional TEM image of GaN HEMT material stack.
Figure 2B:
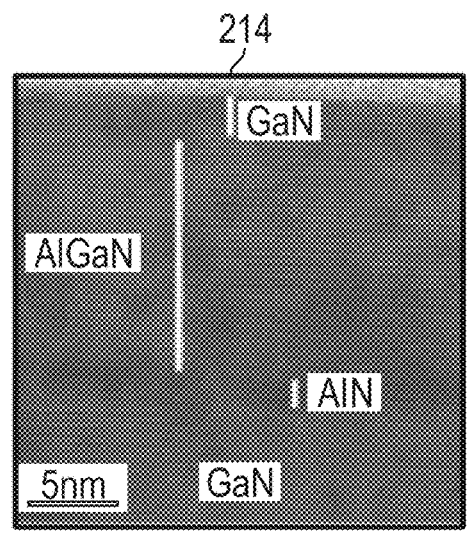
FIG. 2B shows a TEM image of GaN/AlGaN/AlN interface.
Figure 2C:
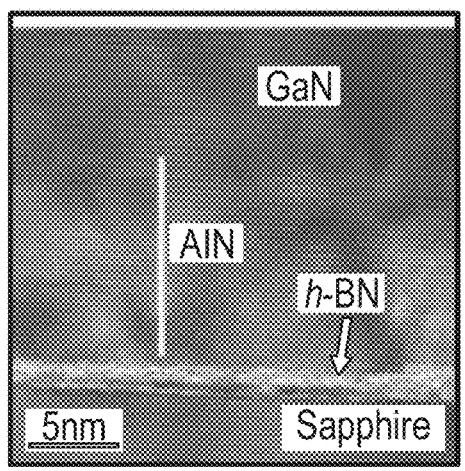
FIG. 2C shows a TEM image of sapphire/h-BN/AN/GaN interface.

FIG. 2A shows a cross-sectional transmission electron microscopy (TEM) image of this structure with high resolution images of the AlGaN/AlN/GaN 202 and AlN/BN/sapphire interfaces 208 shown in FIGS. 2B and 2C.

Figure 2D:
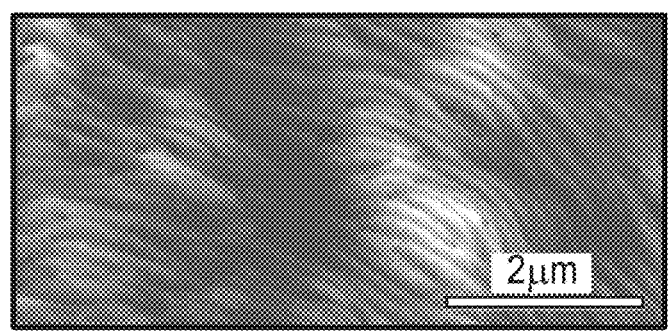
FIG. 2D shows an AFM (Atomic Force Microscopy) image of a top surface.

Further characterization of the BN film growth on sapphire is useful. High-resolution TEM images revealed the high-quality atomically abrupt interface between the GaN, AlN, and AlGaN layers. This quality is further illustrated by low surface roughness (<0.3 nm RMS) revealed by atomic force microscopy (AFM) (FIG. 2D).

Figure 2E:
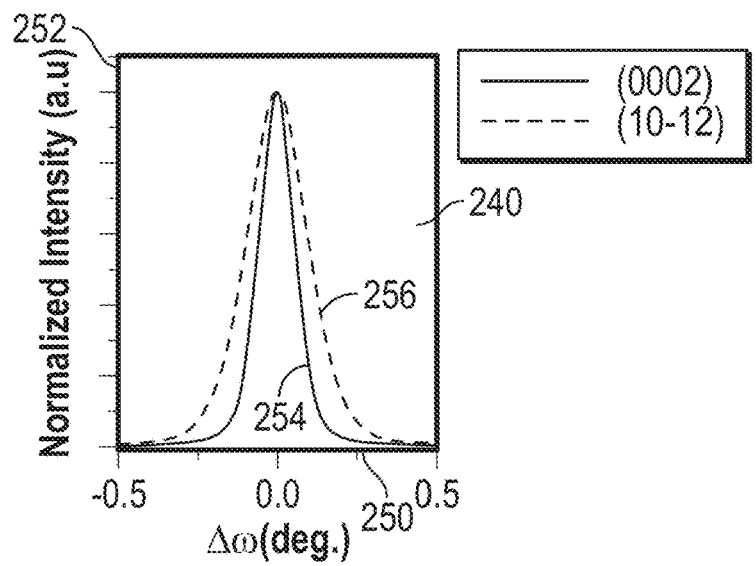
FIG. 2E shows an X-ray rocking curve from a GaN on-axis.

FIG. 2E shows a plot 240 having X-axis 250 showing Δω in degrees and Y-axis 252 showing normalized intensity (a.u). Two X-ray rocking curves (0002) 256 and (10-12) 254 are shown. Two beam dark field TEM were used to quantify material quality with a measured threading dislocation density of less than $3 \times 10^8$ $cm^{-2}$ ($3 \times 10^8/cm^2$). The presented collection of characterization results demonstrated the ability to epitaxially grow GaN HEMT structures on a vdW surface with quality comparable to those on conventional substrates such as sapphire and SiC.

Several GaN HEMT die were fabricated on a 2 inch sapphire wafer that included van der Pauw and transmission line measurement (TLM) test structures. To withstand device processing conditions, the AlGaN/GaN stack remains flat and adequately adhered to the sapphire substrate to ensure good device yield and performance. The requirements of this step reiterated the need for a high-quality vdW buffer. After processing, the devices and test structures were transferred to a 100 μm thick flexible 3M™ adhesive substrate using a polydimethyl sulfoxide (PDMS) elastomeric stamping method. Any suitable method could be used.

The stamping method is devoid of harsh chemicals and processing and is favorable for cost reduction because the growth substrate can be reused for future material depositions. During the transfer process, device structures remained completely intact and free from damage due to the gentle lift-off and transfer method.

Figure 3A:
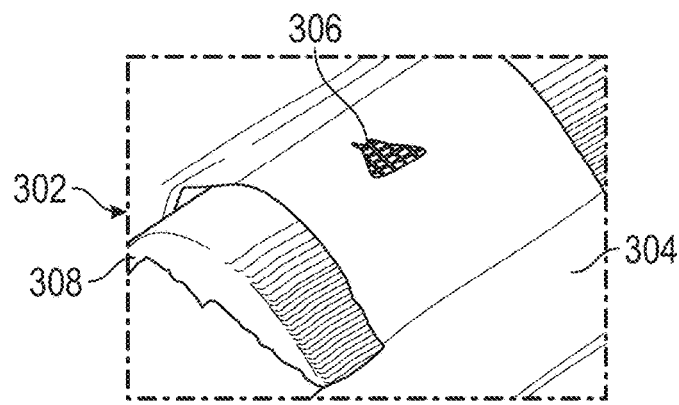
FIG. 3A shows an image of a GaN film with device structures conformed around a 3D printed 12 mm bend radii.

To evaluate critical material properties of the flexible GaN under external applied strain, the GaN and 3M™ adhesive substrate were affixed to a flat surface and under fixed bend radii of 48, 24, and 12 mm (image of bend radii test in FIG. 3A).

FIG. 3A shows an image 302 including a thin film material 304, GaN devices 306 and strain roller device 308. The estimated strain typically directly at the top of the structure 306 can be calculated based upon the thickness of the material 304 further away from the neutral axis as a function of the bend radii applied using the ΔR/R method. The ΔR/R calculation is based on the change in the radius curvature divided by the radius curvature. Alternatively, any suitable method could be used.

Figure 3B:
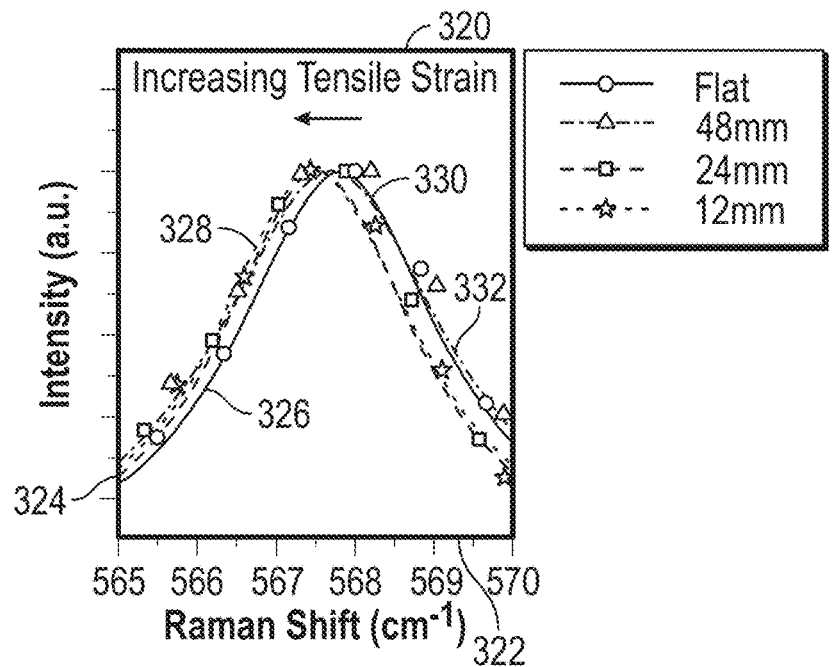
FIG. 3B shows a Raman scan of E peak and the shift peak position as a function of an applied strain.

FIG. 3B shows a graph 320 having X-axis 322 showing Raman Shift ($cm^{-1}$) 565, 566, 567, 568, 569 and 570, Y-axis 324 showing intensity, lines 326 (flat), 328 (48 mm), 330 (24 mm) and 332 (12 mm) are also shown.

The strain values at the 2 DEG AlGaN/GaN interface, for a 48, 24, and 12 mm bend radii were calculated to be 0.21%, 0.43%, and 0.85%, respectively, (with GaN and tape thickness totaling 102 μm and the top of the rigid backing assumed to be at the neutral axis). In addition, the average strain in the AlGaN/GaN HEMT structure can be measured using Raman spectroscopy by evaluating the shift in the GaN Ef mode under the external applied strain.

Tensile (compressive) strain in c-plane GaN results a shift in this mode. FIG. 3B shows the Ef mode measured from the same sample flat and flexed to a bend radii up to 12 mm. A shift of up to 0.3 $cm^{-1}$ (0.3/cm) is evident when the transferred GaN film was taken from a flat state to the 12 mm radii. After bending and flattening, the GaN films revert to the strain conditions before the experiment started.

A total average shift of increasing tensile strain of 0.8% is measured in close agreement with the ΔR/R calculated values. The Raman studies described here reveal an important observation that the strain applied to the flexible GaN films and devices are not simply accommodated by the underlying substrate, but are in fact imparting a reversible, temporary deformation of the GaN lattice from the external strain.

Figure 3C:
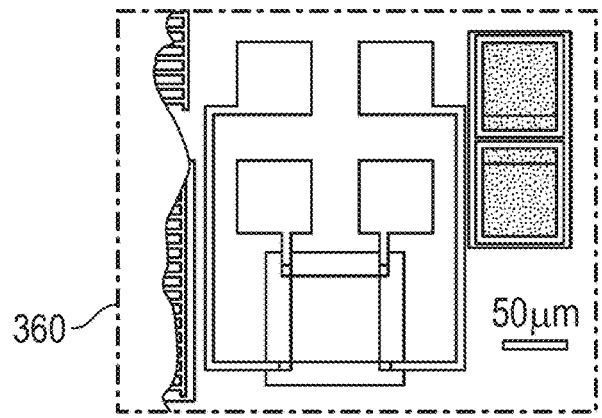
FIG. 3C shows a GaN van der Pauw test structure transferred to a flexible substrate for mobility and sheet carrier density measurements.

FIG. 3C shows a graph 370 with X-Axis 372 showing a percent strain and Y-Axis 374 showing mobility $cm^2/Vs$. Line 378 shows the data plotted.

Figure 3D:
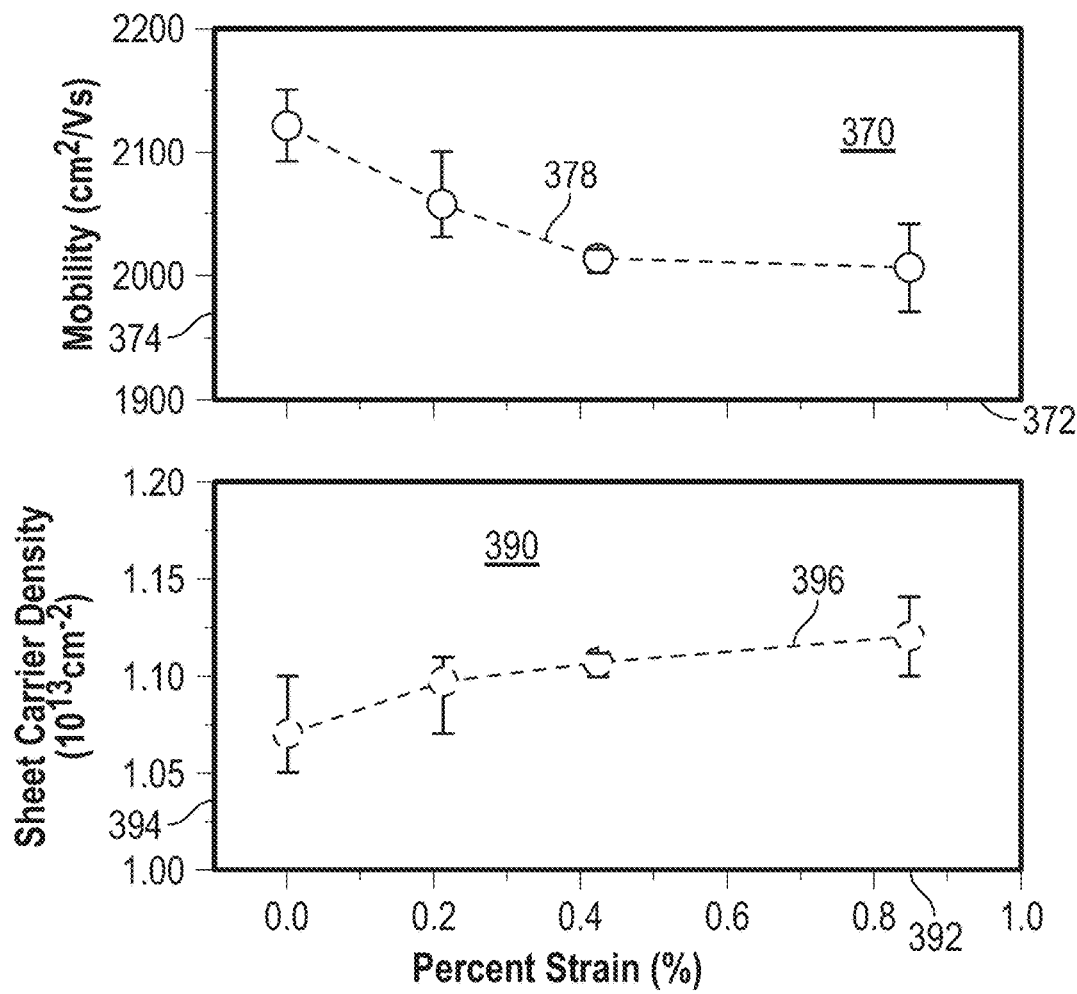
FIG. 3D shows measured mobility and sheet carrier density of the flexible GaN films on tape substrate using strain values from the ΔR/R method.

FIG. 3D shows a graph 390 with X-Axis 392 showing a percent strain and Y-Axis 394 showing sheet carrier density ($10^{13}$ cm$^{-2}$). Line 396 shows the data plotted.

The post-transferred AlGaN/GaN material heterostructure on the flexible substrate exhibited extremely high measured mobility in a flat state at 2120 cm$^2$/Vs and the value was reduced to 2005 cm$^2$/Vs upon straining to the maximum bend radii of approximately 12 mm (approximately 0.85% strain). As shown in FIG. 3D using the van der Pauw structure shown in FIG. 3C, the sheet carrier density appeared to exhibit the opposite trend with a change from approximately 1.07 to $1.12 \times 10^{-13}$ cm$^{-2}$ ($1.12 \times 10^{-13}$/cm$^2$), a total increase of approximately 4.7%. At the maximum strain condition, an increase in n5 by approximately $6.9 \times 10^{11}$ cm$^{-2}$ is expected due to increased piezoelectric induced charge, which is very close to the measured value of $5.0 \times 10^{11}$/cm$^2$ observed in the measurements. The product of the mobility and sheet carrier density is directly related to the inverse of the sheet resistance, which slightly increases but remains within 1% of the starting value. The values of mobility and sheet carrier density on the flexible tape exceed previous data of GaN HEMTs grown on 2D materials and represent state of the art electron transport behavior even for rigid AlGaN/GaN structures grown on conventional substrates.

The 2 DEG transport properties reflect the favorable material quality and importance for epitaxial growth of GaN on a high-quality 2D BN layer.

Similar GaN devices for lift-off and transfer are grown on silicon and are typically of lower quality due to, inter alia, a lattice mismatch of more than 17%, substrate bowing, and thermal expansion mismatch. This leads to a reduction in 2 DEG mobility of GaN devices on Si by as much as 10% as compared to the flexible devices measured here.

Figure 4A:
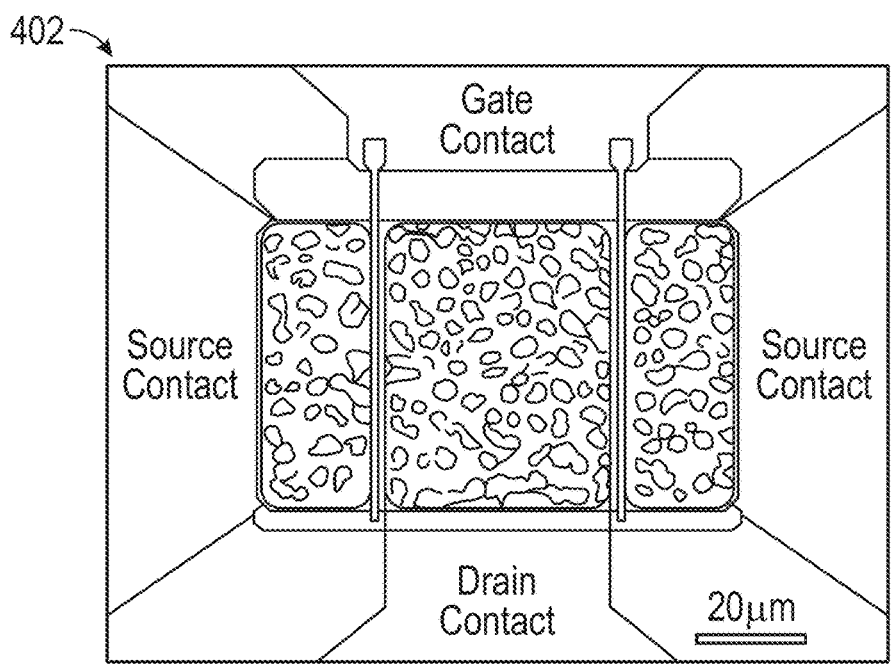
FIG. 4A shows an optical image of a transferred GaN HEMT device on a flexible substrate.

FIG. 4A shows an optical image 402 of a flexible 2×50 µm HEMT device with a gate length of 170 nm that was transferred from the growth substrate. The image of the undamaged device highlights the ability of the PDMS stamping method to transfer high-quality, fragile device structures without visible damage. Initial DC and RF characterization reveal that the electrical performance is retained upon transfer of the device to the flexible substrate. The change in substrate from the rigid, higher thermal conductivity sapphire to the flexible 3M™ adhesive tape resulted in a decrease in observed transconductance and drain current at forward gate bias voltage due to thermal effects.

The reduction at higher Ve is also observed in similar devices transferred to flexible substrates, where as much as an approximately 90% reduction in RF power density as compared to GaN on SiC is observed. For high-power applications flexible and/or conformal substrates such as metal foils could be used to overcome the self-heating limits imparted by the low thermal conductivity flexible substrates used here.

To evaluate the flexible electrical performance of the GaN devices, a transferred HEMT was conformed around the same 3D-printed cylinders as were used in the mobility measurements.

Figure 4B:
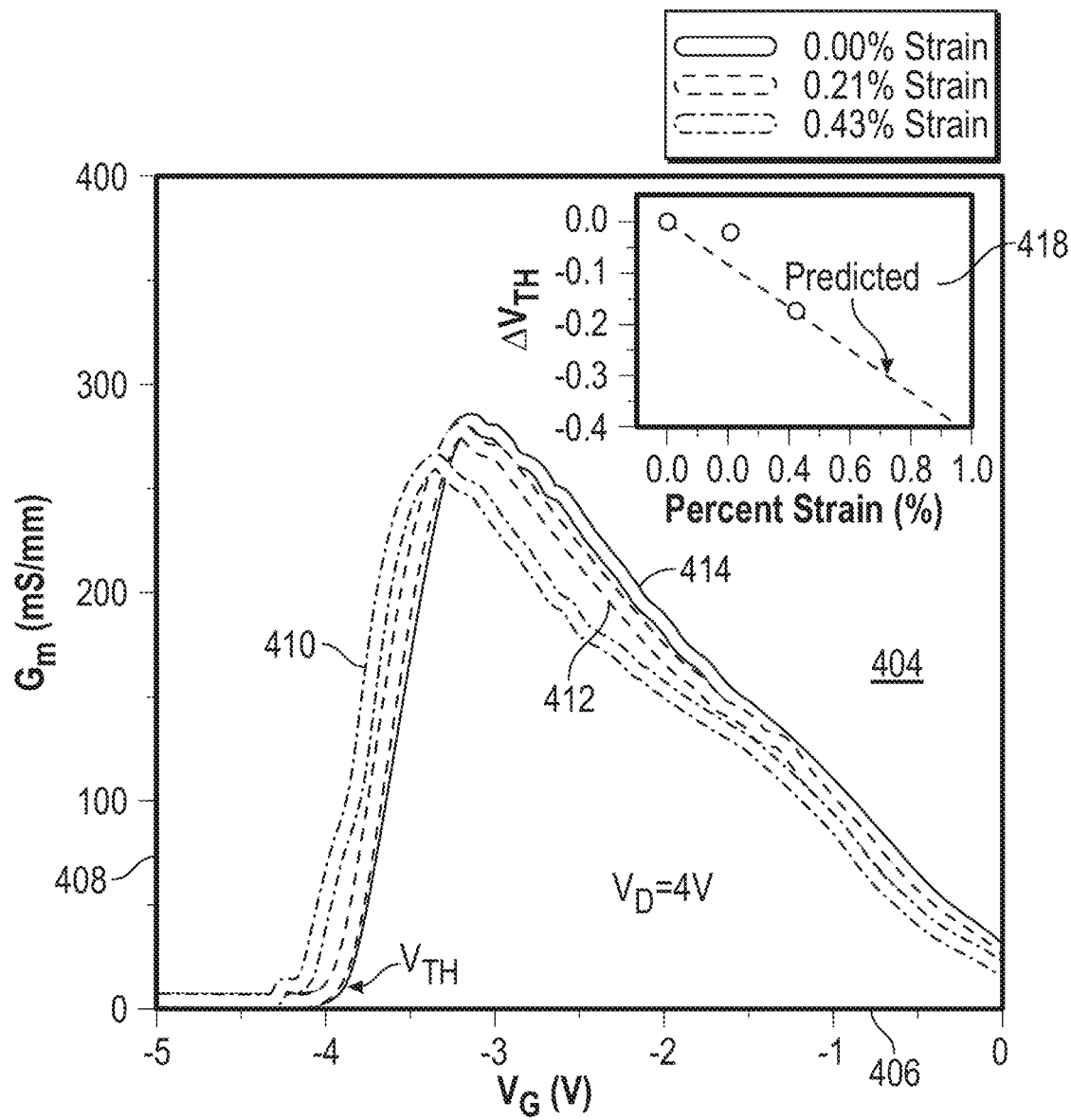
FIG. 4B shows a plot portraying the change in DC parameters as the high performance GaN devices are placed under external strain.

FIG. 4B shows a graph 404 having X-Axis 406 $V_G$(V), Y-Axis 408 $G_m$ (mS/mm). Lines 410, 412 and 414 show 0.00% strain, 0.21% strain and 0.43% strain, respectively. Insert 418 shows predicted percent strain.

Figure 4C:
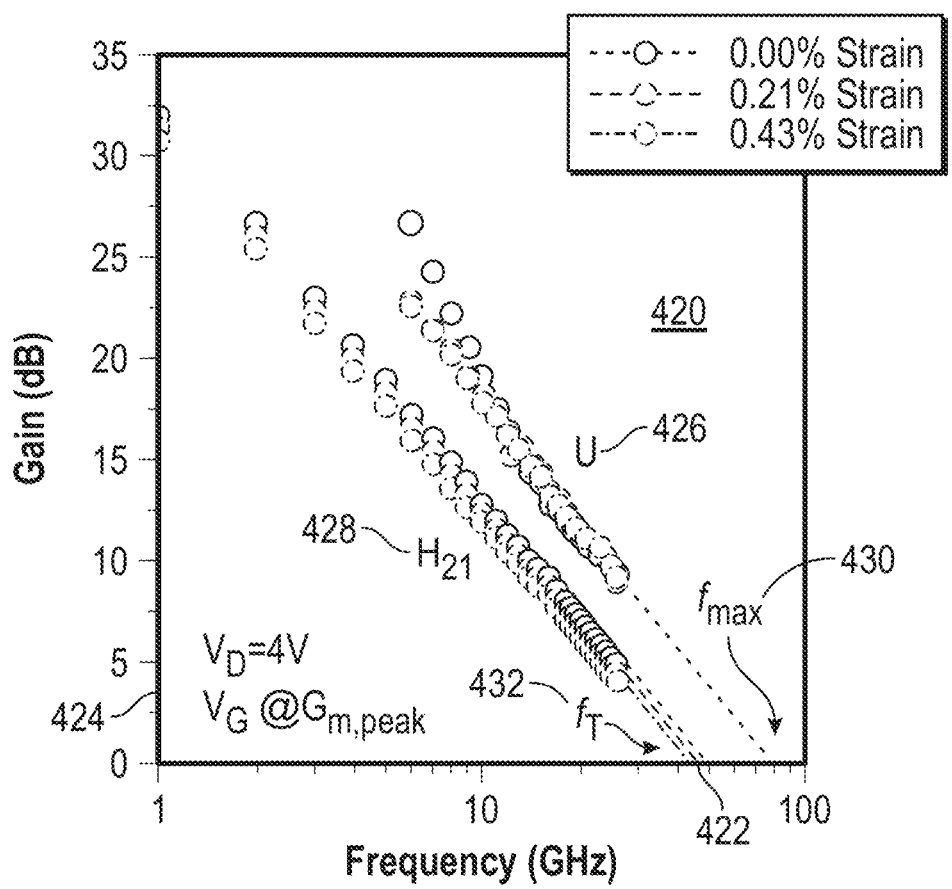
FIG. 4C shows RF performance of an extrinsic current gain and unilateral power gain.

FIG. 4C shows graph 420 with X-axis 422 (Frequency GHz) and Y-Axis 424 (Gain dB). The three strain percentages (0.00, 0.21 and 0.43) are plotted as well as $H_{21}$ 428 and U 426. The quantities $f_T$ 432 and $f_{max}$ 430 are also shown.

Figure 4D:
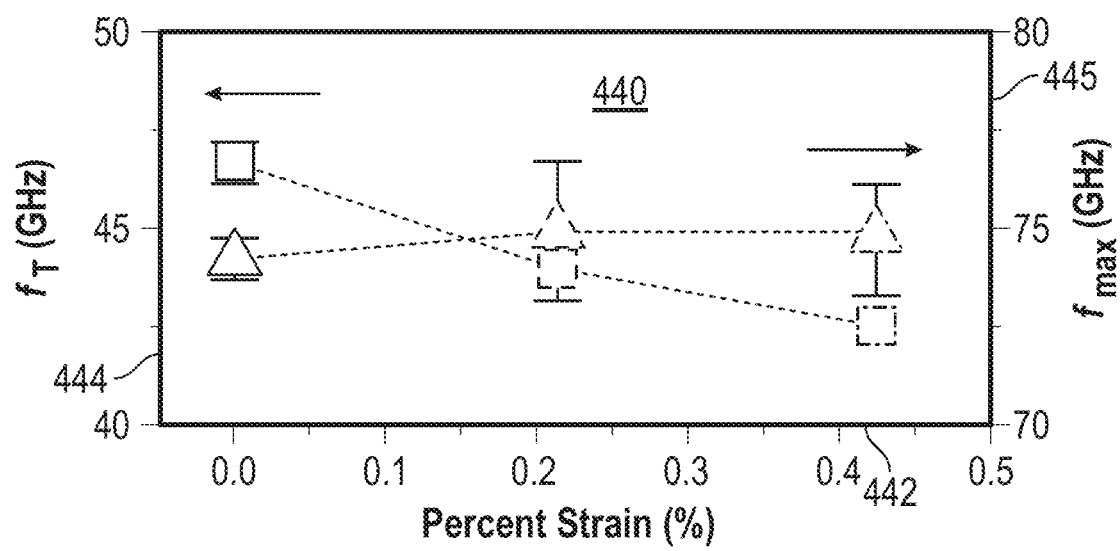
FIG. 4D shows $f_T$ and $f_{max}$ values for RF testing as a function of applied external strain.

FIG. 4D shows a graph 440 with X-axis (percent strain) 442, left Y-axis $f_T$ (GHz) 444, and right Y-axis $f_{max}$ 445. Various data points are shown on plot 440.

The DC performance of the flexible GaN HEMTs appeared to be impacted by the applied strain, as portrayed in FIG. 4B. In this case, the peak transconductance value ($Gm_{peak}$) and current density ($1_0$) at 0 V was reduced by a total of 8.1% and 7.7%, respectively, when compared to the device from the soft substrate in a flat state to a conformed state at 24 mm bend radii (approximately 0.43% estimated strain). After the device was moved to the 12 mm bend radii (approximately 0.83% estimated strain) the device failed during testing due to a crack forming through the device orthogonal to the strain direction presumably due to the increased piezoelectric strain as well as sample degradation, and further testing could not be performed.

The change in DC parameters as a function of strain is believed to be a combination of two independent mechanisms. The reduction in peak transconductance upon bending has been observed for other tests of similar GaN devices and is presumed to be a product of the reduction in mobility as well as the inherent degradation and a change of strain state within the device.

The second indication of the physical impact on the DC performance is the shift in the threshold voltage (Vrn) of −0.03 and −0.17 V under the influence of approximately 0.21% and approximately 0.43% strain, respectively, which is related to the polarization-induced charge density increasing under applied tensile strain.

Notably, the 2D electron gas (2 DEG) at the AlGaN/GaN interface does not typically arise from ionized donors but instead from spontaneous and piezoelectric polarization difference between the Wurtzite GaN and AlGaN crystals. The piezoelectric coefficient of AlGaN is greater than GaN, causing a net increase in the charge carrier density at the interface with tensile strain. The increase is estimated to be approximately $3.2 \times 10^{11}$ cm$^{-2}$ at the approximately 0.43% strain condition for our structure, which is in excellent agreement to the measured $3.5 \times 10^{11}$ cm$^{-2}$ shown in FIG. 3C.

The resultant increase in carriers leads to a calculated shift in threshold voltage caused solely by the piezo-expansion effect that matches well with the observed data and is shown in the inset 418 of FIG. 4B.

FIG. 4C shows small signal RF gain characterization 420, where the cutoff-frequency, $f_r$, 432 and maximum oscillation frequency, $f_{max}$, 430 at zero external applied strain was extrapolated with a −20 dB/dec fit to be 47 and 74 GHz, respectively, giving an RF figure of merit (the product of the cutoff frequency and gate length $f_T \times Le$) equal to 8 GHz µm. This RF performance is superior to previously reported GaN HEMT studies limited to transfer onto a flat, soft substrate, which report an RF figure of merit <4 GHz µm.

Higher RF performance is attributed to the high-quality epitaxial layer transfer enabled by GaN growth on van der Waals 2D substrates rather than Si. The extrapolated cutoff frequency is reduced by approximately 9.0% under applied strain due to the linear relationship of cutoff frequency with DC transconductance. After approximately 0.43% external applied strain, $f_T$, 432 slightly decreases to approximately 42 GHz, as shown in FIG. 4D. For the devices measured in this study, the $f_{max}$ 430 of the 0.17 µm gate length devices remains nearly constant (within 1% of the initial value) around approximately 74 GHz throughout straining. This is a direct result of the unchanged device parasitic (Re, RSH) due to favorable material quality during growth, transfer, and straining, and a weaker dependence on transconductance as compared to $f_T$, where $f_{max}$ 430 is proportional to the square root of the transconductance.

The RF results reveal that the GaN material retains favorable $f_{max}$ and a slight reduction in $f_T$ at higher strain rates, but overall still behaves exceptionally well with regards to high frequency performance. In future flexible and conformal RF systems, GaN devices strained beyond approximately 0.43% tensile strain may utilize additional strain mitigation strategies during device operation.

The growth of GaN on 2D BN is desirable to unlocking high-quality flexible devices, as the BN serves two purposes: an epitaxial template for high-quality GaN that approaches state of the art electrical performance and provides a technique, or vehicle, to transfer the devices without the use of harsh chemicals or etchants. The transferred flexible GaN/AlGaN structures are demonstrated to exhibit high electron mobility and sheet carrier density that exceeded 2000 $cm^2V^{-1}s^{-1}$ (2000 $cm^2/Vs$) and $1.07 \times 10^{13}$ $cm^{-2}$, respectively, and show inverse behavior upon straining.

The GaN material is highly influenced by the applied strain in the observed piezoelectric-induced charge at the heterostructure interface. Flexible GaN HEMT devices display desired DC and RF properties when exposed to as high as 0.43% strain with an extrapolated $f_T$ and $f_{max}$ at approximately 42 and approximately 74 GHz, respectively, corresponding to the first RF performance of a T-gated GaN HEMT transferred using a 2D release layer and under an external applied strain.

Experiments and Results

Some solutions provided by the embodiments described herein were experimentally verified as described below. The following descriptions are only examples of some of the experiments conducted with respect to some of the embodiments herein, and accordingly the materials, processes, size and/or temperature parameters, and equipment, as well as the results that were achieved are only representative examples and are not meant to limit the scope of the embodiments herein.

Boron nitride films were deposited by low pressure MOCVD on sapphire at 1000° C. from triethylboron and $NH_3$ with a V/III ratio of 2250 and pressure of 20 Torr. SN/sapphire templates were then loaded into an EMCORE Dl 80™ MOCVD system for growth of AlGaN/GaN (HEMT) structures. Ammonia, trimethylaluminum, trimethylgallium, and ferrocene were used as N, Al, Ga, and Fe precursors. A 15 nm thick AlN nucleation layer was deposited at 1000° C. using a V/III ratio of 2300 followed by a three-step process for high temperature (1025° C.) growth of a 1.5 µm Fe doped GaN, 0.5 µm undoped GaN layer, 2 nm AlN insert layer, 17 nm AlGaN boundary layer with 27% Al, and 3 nm GaN cap layer.

The AlGaN/GaN structures were characterized by high resolution TEM using a FEI Tecnai TF -20 FEG/TEM. Cross-sectional samples were prepared using the in situ FIB lift out technique on an FEI Dual Beam focused ion beam (FIB)/scanning electron microscope (SEM).

Surface morphology was measured by AFM (atomic force microscope) using a Bruker Dimension Icon AFM operating in tapping mode. X-ray diffraction rocking curves of (0002) and (1012), (as shown in FIG. 2E) under symmetric and quasi-symmetric co-scan configurations respectively, using an Empyrean X'pert Pro™ system with a four bounce Ge monochrometer. Transport properties were measured at room temperature using an Accent 5500 Hall-effect measurement system and Leighton LEI contactless system.

AlGaN/GaN HEMTs were fully fabricated on the 2D SN/Sapphire substrate. First, electrical mesa-isolation was achieved by inductively coupled plasma with $BCl_3/Cl_2/Ar$ chemistry to a depth of 80 nm. Ohmic contacts consisting of Ti/Al/Ni/Au were deposited by electron beam evaporation and subjected to rapid thermal annealing at 850° C. for 30 s in nitrogen ambient. Next, electron beam lithography T-gates with nominal 0.17 µm gate length were formed with tri-layer polymethyl methacrylate) (PM MA)/methyl methacrylate (M MA)/PM MA resist process and metallized with Ni/Au to form a Schottky gate contact. Metal interconnects with RF pad layout were patterned and metallized with Ti/Au, and a 200 nm $Si_3N_4$ passivation layer was deposited and etched with $CF_4/O_2$ reactive ion etching.

Process control monitor and TLM structures were used for four point probe DC measurements on a Keithley 450 test system. The DC and RF performance of the HEMTs were characterized with an automated system consisting of an HP4142 parametric analyzer and HP8510 network analyzer with Cascade probes. S-parameters were measured from 1 to 26 GHz at VDs=4 V and Vcs approximately equal to the gate bias corresponding to peak transconductance.

Some of the illustrative aspects of the present disclosure may be advantageous in solving the problems herein described and other problems not discussed which are discoverable by a skilled artisan. While the above description contains much specificity, these should not be construed as limitations on the scope of any embodiment, but as exemplifications of the presented embodiments thereof. Many other ramifications and variations are possible within the teachings of the various embodiments. While the disclosure has been described with reference to exemplary embodiments, it will be understood by those skilled in the art that various changes may be made and equivalents may be substituted for elements thereof without departing from the scope. In addition, many modifications may be made to adapt a particular situation or material to the teachings without departing from the essential scope thereof.

Therefore, it is intended that the disclosure not be limited to the particular embodiment disclosed as the best or only mode contemplated for carrying out this invention, but that the disclosure will include all embodiments falling within the scope of the appended claims. Also, in the drawings and the description, there have been disclosed exemplary embodiments and, although specific terms may have been employed, they are unless otherwise stated used in a generic and descriptive sense only and not for purposes of limitation, the scope of the disclosure therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item. Thus, the scope of the disclosure should be determined by the appended claims and their legal equivalents, and not by the examples given.

The invention claimed is:
1. A method comprising:
providing a substrate;
mounting a semiconductor layer on a surface of the substrate, via an interface;
forming the interface using one of an adhesive and van der Waals forces, where the semiconductor layer provides a radio-frequency device that is operable to amplify microwave radio frequencies.

2. The method as claimed in claim 1, further comprising: amplifying microwave radio frequencies by the radio frequency device from approximately 300 MHz to approximately 300 GHz.

3. The method as claimed in claim 1, further comprising: forming the semiconductor layer using a gallium nitride layer.

4. The method as claimed in claim 3, further comprising: forming the gallium nitride layer with a heterostructure $(Al_x,In_y)Ga_{1-x-y}N$-material.

5. The method as claimed in claim 3, further comprising: forming the gallium nitride layer as a thin film.

6. The method as claimed in claim 3, where the substrate material supports the gallium nitride layer.

7. The method as claimed in claim 1, where the radio frequency device is operating under an externally applied strain of greater than 0% but less than 100%.

8. A method comprising:

providing a substrate;

mounting a semiconductor layer on a surface of the substrate, via an interface, where the semiconductor layer provides a radio-frequency device that is to amplify microwave radio frequencies, where the radio-frequency device comprises one of a $(Al_x,In_y)Ga_{1-x-y}N$-based heterostructure device, a flexible and strainable radio-frequency amplifier, and a $(Al_x,In_y)Ga_{1-x-y}N$-based high-electron mobility transistor (HEMT).

9. The method as claimed in claim 8, further comprising: growing the $(Al_x,In_y)Ga_{1-x-y}N$-based heterostructure device directly on the substrate.

10. The method as claimed in claim 8, further comprising: transferring the $(Al_x,In_y)Ga_{1-x-y}N$-based heterostructure device to the substrate.

* * * * *